US012751213B2

(12) United States Patent

Park et al.

(10) Patent No.: US 12,751,213 B2

(45) Date of Patent: Sep. 29, 2026

(54) HIGH VOLTAGE DEVICES WITH MULTIPLE POLYIMIDE LAYERS

(71) Applicant: TEXAS INSTRUMENTS INCORPORATED, Dallas, TX (US)

(72) Inventors: YongSeok Park, Coppell, TX (US); Makarand Ramkrishna Kulkarni, Dallas, TX (US); Ricky Alan Jackson, Richardson, TX (US); Byron Lovell Williams, Plano, TX (US); Thomas Dyer Bonifield, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 231 days.

(21) Appl. No.: 16/886,130

(22) Filed: May 28, 2020

(65) Prior Publication Data

US 2020/0381342 A1 Dec. 3, 2020

Related U.S. Application Data

(60) Provisional application No. 62/853,505, filed on May 28, 2019.

(51) Int. Cl.

*H10N 52/80* (2023.01)
*G01R 15/20* (2006.01)

(52) U.S. Cl.

CPC .......... *H10N 52/80* (2023.02); *G01R 15/202* (2013.01)

(58) Field of Classification Search

CPC .............. H01L 43/04; H01L 24/26-27; H01L 24/42-49; H01L 2224/26-33519; H01L 2224/42-49505; H01L 23/3107; H01L 23/49541; H01L 23/3192; H10N 52/80

See application file for complete search history.

(56) References Cited

U.S. PATENT DOCUMENTS

| | | | | |
|---|---|---|---|---|
| 2006/0152210 | A1* | 7/2006 | Mangtani | G01R 1/36 174/536 |
| 2013/0020660 | A1* | 1/2013 | Milano | G01R 15/207 257/E27.005 |
| 2017/0184636 | A1* | 6/2017 | Racz | H01L 43/06 |
| 2017/0271274 | A1* | 9/2017 | Hinata | H01L 23/3142 |
| 2018/0204791 | A1* | 7/2018 | Chen | H01L 25/0652 |
| 2020/0091415 | A1* | 3/2020 | Burssens | G01R 33/24 |
| 2020/0294876 | A1* | 9/2020 | Cai | H01L 23/544 |

* cited by examiner

*Primary Examiner* — Lauren R Bell

(74) *Attorney, Agent, or Firm* — Yudong Kim; Frank D. Cimino

(57) ABSTRACT

In examples, a semiconductor package comprises a first conductive terminal; a second conductive terminal; a conductive pathway coupling the first and second conductive terminals, the conductive pathway configured to generate a magnetic field; a semiconductor die including a circuit configured to detect the magnetic field; and first and second polyimide layers positioned between the conductive pathway and the semiconductor die.

31 Claims, 13 Drawing Sheets

HIGH VOLTAGE DEVICES WITH MULTIPLE POLYIMIDE LAYERS

CROSS-REFERENCE TO RELATED APPLICATIONS

The present application claims priority to U.S. Provisional Patent Application No. 62/853,505, which was filed May 28, 2019, is titled "Multiple Polyimide Layers For High Voltage/Isolation Flip-Chip Device," and is hereby incorporated herein by reference in its entirety.

BACKGROUND

High voltage devices call for isolation layers between conductive components. Such an isolation layer may include a mold compound, for example. In such high voltage devices, large potentials (e.g., 300-1000 volts) are placed across the isolation layer. For example, in a Hall sensor package, a curved conductive pathway is used to generate magnetic fields that are detected and measured by a circuit on the semiconductor die. The curved conductive pathway is separated from the circuit by an isolation layer, which is routinely subjected to large potentials between the curved conductive pathway and the circuit.

SUMMARY

In examples, a semiconductor package comprises a first conductive terminal; a second conductive terminal; a conductive pathway coupling the first and second conductive terminals, the conductive pathway configured to generate a magnetic field; a semiconductor die including a circuit configured to detect the magnetic field; and first and second polyimide layers positioned between the conductive pathway and the semiconductor die.

In examples, a method comprises providing a semiconductor die having an active surface, the active surface including a circuit for detecting a magnetic field, the circuit covered by a first polyimide layer, the first polyimide layer covered by a second polyimide layer. The method comprises coupling a bond pad on the active surface to a conductive terminal. The method comprises positioning a conductive pathway relative to the semiconductor die such that the first and second polyimide layers are between the conductive pathway and the semiconductor die, the conductive pathway to produce the magnetic field. The method also comprises positioning a mold compound layer between the second polyimide layer and the conductive pathway.

BRIEF DESCRIPTION OF THE DRAWINGS

For a detailed description of various examples, reference will now be made to the accompanying drawings in which.

DETAILED DESCRIPTION

Figure 1A:
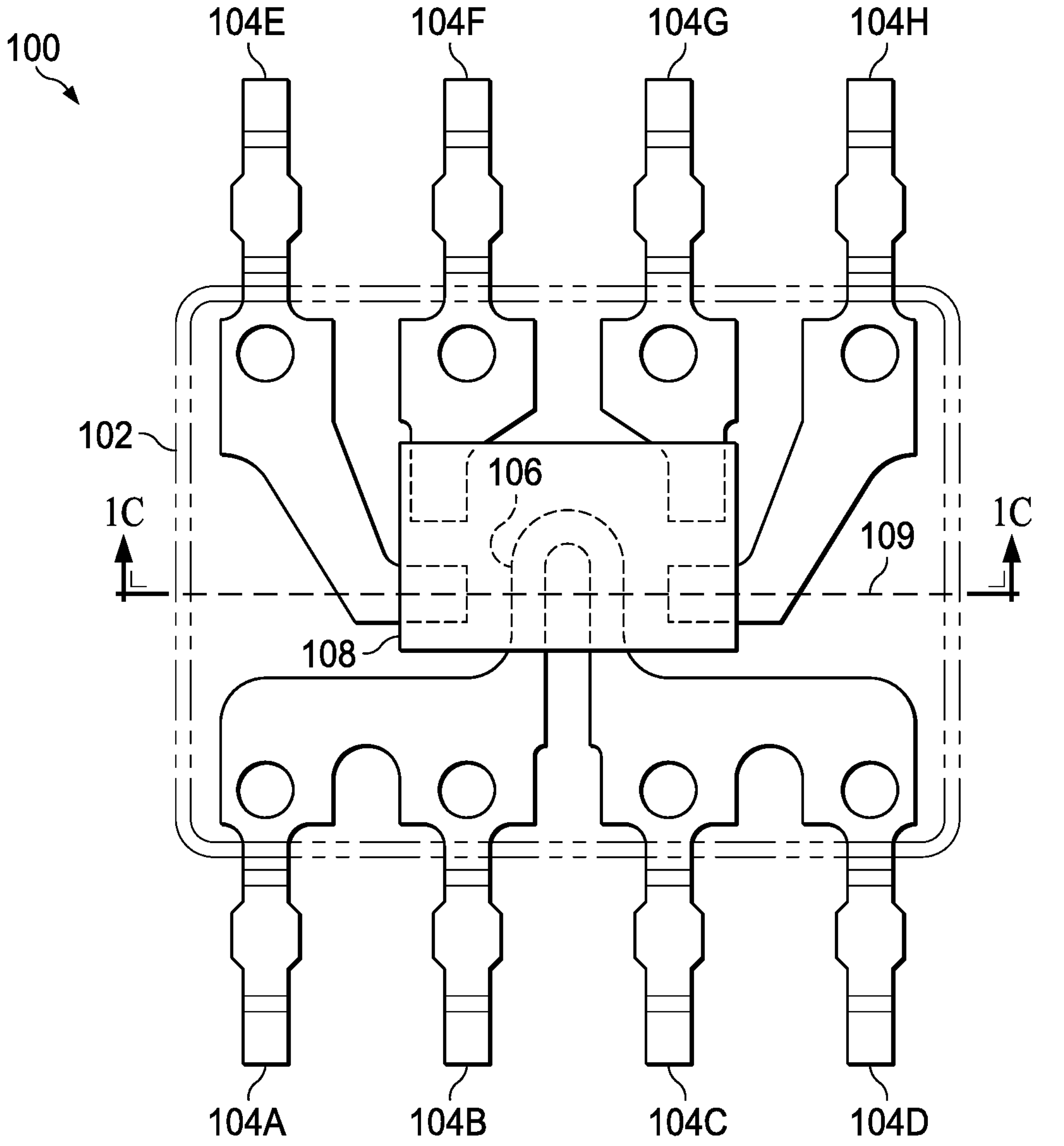
FIGS. 1A-1I depict various views of various features of flip-chip Hall sensor packages comprising multiple polyimide layers, in accordance with various examples.

In a Hall sensor package, high currents are passed through a curved conductive pathway to generate a magnetic field. The semiconductor die contains a Hall sensor circuit that detects and measures the magnetic field, and the measured magnetic field can be used to determine the current that flowed through the curved conductive pathway. In this way, the Hall sensor package serves as a current measurement device.

The space between the curved conductive pathway and the circuit is generally filled with a dielectric (e.g., a mold compound), so as to achieve electrical isolation between the curved conductive pathway and the circuit. Due to physical limitations in the mold compound injection process, however, this mold compound may contain air gaps. If the air gaps are in the area between the curved conductive pathway and the Hall sensor circuit that measures the magnetic fields, the performance, integrity, and durability of the Hall sensor package can be compromised. As merely one example, air gaps (or "voids") in the mold compound result in high electric fields inside such gaps. This prematurely ages the mold compound and comprises the functional integrity of the Hall sensor package, for example, by contributing to breakdown of the mold compound. The breakdown voltage of the mold compound is reduced by the presence of these voids.

This disclosure describes a high voltage electronic device, such as a Hall sensor package, that includes multiple (i.e., two or more) polyimide layers in an isolation layer between conductors in the device. For example, in the context of a Hall sensor package, multiple polyimide layers are positioned between the curved conductive pathway, which generates a magnetic field, and the semiconductor die Hall sensor circuit, which measures the magnetic field. One or more other insulative layers, for example a mold compound layer, also may be positioned between the curved conductive pathway and the circuit. Although high potentials are realized between the curved conductive pathway and the circuit, and although the mold compound layer may contain voids, the multiple polyimide layers prevent the compromises in structural and functional integrity described above. This is because polyimide, unlike mold compounds, is a void-free dielectric material. Thus, the presence of voids (or air gaps) in the isolation layer between the curved conductive pathway and the circuit is mitigated or eliminated. Moreover, even if voids remain in the portion of the isolation layer composed of mold compound, any subsequent loss in dielectric strength in the mold compound caused by such voids has little or no effect on the functional integrity of the Hall sensor package, as the multiple polyimide layers still provide adequate isolation between the curved conductive pathway and the circuit. Significantly, these benefits are attained without increasing the distance between the curved conductive pathway and the Hall sensor circuit. Increasing this distance could provide adequate isolation, but the distance could be excessive in light of the sensitivity of the Hall sensor circuit and its ability to detect and measure magnetic fields generated by the curved conductive pathway. The multiple polyimide layered structures described herein, however, enable adequate isolation without necessitating an increase in the distance between the curved conductive pathway and the Hall sensor circuit.

The use of multiple polyimide layers in this manner produces the above-described structural and functional benefits, but it also provides additional manufacturing and market benefits. For example, manufacturing and testing yields are improved when dielectric breakdowns are mitigated by the use of multiple polyimide layers as described herein. Similarly, end-users experience increased product durability and longevity. In addition, not only is dielectric quality improved (e.g., due to a reduction in voids), but due to the use of the spin-coating technique, the thickness of the polyimide layers is easily controlled. Costs may also be lowered relative to other techniques due to low material expenses.

The remainder of this disclosure describes various examples of Hall sensor packages that include multiple polyimide layers for high voltage isolation between curved conductive pathways and semiconductor dies. However, the scope of this disclosure is not limited to Hall sensor packages. Rather, the examples described herein may be extended for application in any of a variety of high voltage devices, so long as multiple (i.e., two or more) polyimide layers are used to isolate conductive components.

FIG. 1A depicts a top-down view of a Hall sensor package 100 comprising multiple polyimide layers, in accordance with various examples. The package 100 is a semiconductor package, meaning that the package 100 includes a semiconductor die that performs one or more functions. The package 100 comprises a package body 102 and a plurality of conductive terminals 104A-104H. In some examples, the conductive terminals 104A-104D are positioned in a row on one side of the package body 102, and the conductive terminals 104E-104H are positioned on an opposing side of the package body 102. Because the package 100 is a high voltage device, the conductive terminals 104A-104D may be spaced appropriately from the conductive terminals 104E-104H to achieve suitable creepage and clearance distances.

In examples, the conductive terminals 104A and 104B couple together inside the package body 102, as shown. In examples, the conductive terminals 104C and 104D couple together inside the package body 102, as shown. In examples, each of the conductive terminals 104E-104H is electrically separate from the remaining conductive terminals, as shown. Although the conductive terminals 104A-104H are depicted as gullwing style leads, in examples, any of a variety of other lead styles and/or corresponding package styles may be used in lieu of the gullwing style leads. In examples, the conductive terminals 104A-104D are high voltage terminals and are suited for carrying large (e.g., power) currents, while conductive terminals 104E-104H are low voltage terminals suited for carrying data signals.

The package body 102 further includes a semiconductor die 108. The semiconductor die 108 may contain any suitable circuitry designed for any desired purpose. In examples, the semiconductor die 108 includes an active surface on which at least some such circuitry is positioned. In the view of FIG. 1A, the active surface of the semiconductor die 108 is facing downward, i.e., away from the reader. The active surface of the semiconductor die 108 may include, for instance, a Hall sensor circuit configured to detect and measure magnetic fields.

One such magnetic field may be generated by current flowing through a curved conductive pathway 106. The term "curved," as used herein, means deviating from being straight for at least a portion of a length. The curved conductive pathway 106 couples the conductive terminals 104A, 104B to conductive terminals 104C, 104D, as shown. Current flows between the conductive terminals 104A, 104B and the conductive terminals 104C, 104D via the curved conductive pathway 106, thereby causing the curved conductive pathway 106 to generate the aforementioned magnetic field. This magnetic field is detected and measured by the Hall sensor circuit on the active surface of the semiconductor die 108. These measurements of the magnetic field may subsequently be used to determine the current flowing through the curved conductive pathway 106 and/or for any of a variety of other suitable purposes.

In some examples, the various conductive terminals 104A-104H and the curved conductive pathway 106 comprise a suitable metal or metal alloy, for instance, copper. In some examples, the semiconductor die 108 comprises, e.g., silicon or another suitable semiconductor.

Although not visible in the top-down view of FIG. 1A, the semiconductor die 108 and the curved conductive pathway 106 positioned below the semiconductor die 108 are separated by a distance, and this area between the semiconductor die 108 and the curved conductive pathway 106 is filled by at least two separate polyimide layers. The term "at least two" is considered synonymous with "two or more" and excludes "only one." As described below, these polyimide layers may or may not abut each other. Other layers also may be present between the curved conductive pathway 106 and the semiconductor die 108, for example, one or more other insulative layers that may include one or more mold compound layers, one or more resist layers, and/or one or more tape layers. The polyimide and other insulative layers are visible in alternate views and are described below with respect to, e.g., FIGS. 1C, 1D, and 1G-1I.

Figure 1B:
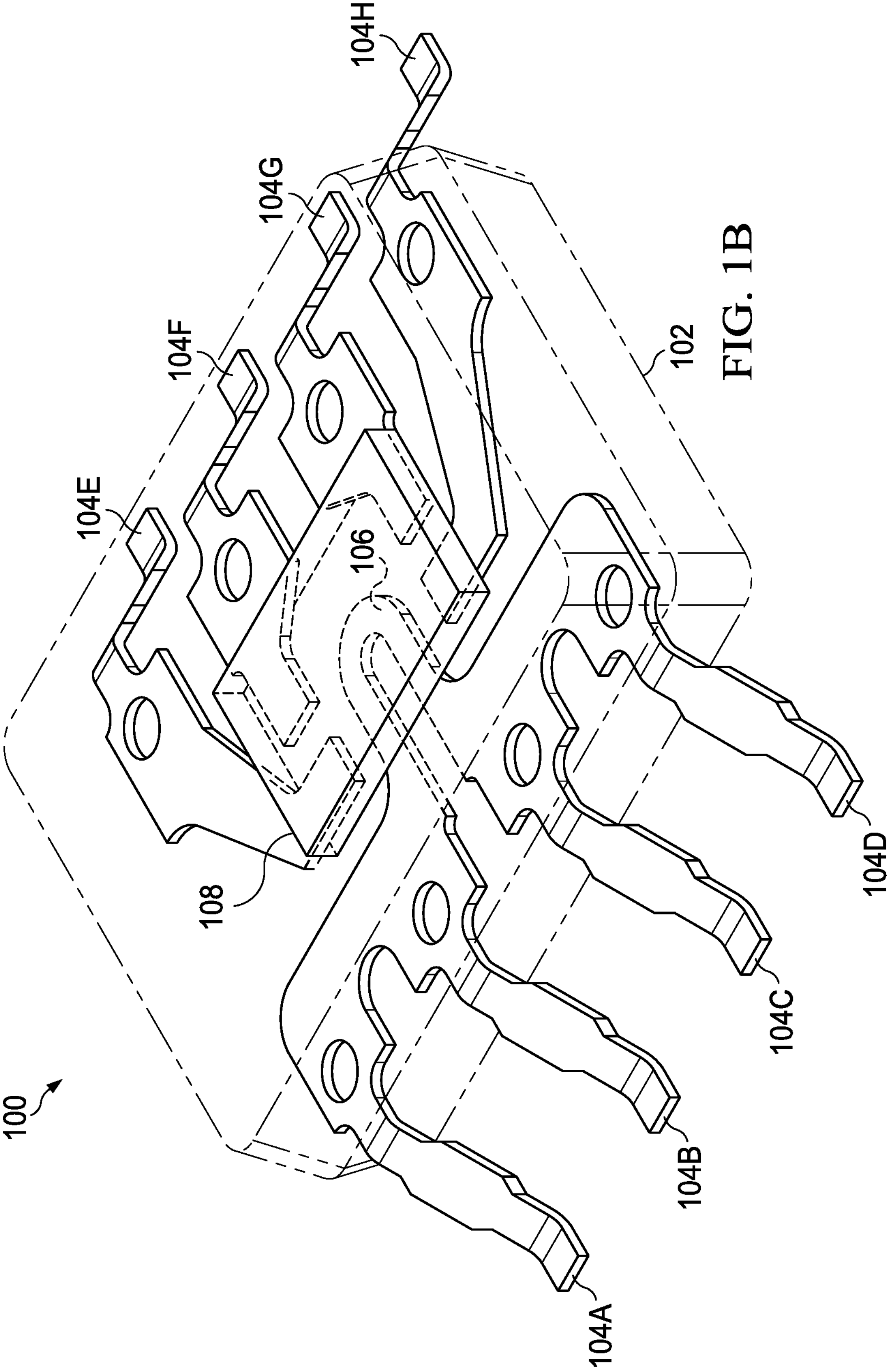

FIG. 1B depicts a perspective view of the Hall sensor package 100 of FIG. 1A, in accordance with various examples. FIG. 1B depicts the package body 102, conductive terminals 104A-104H, curved conductive pathway 106, and semiconductor die 108 described above.

Figure 1C:
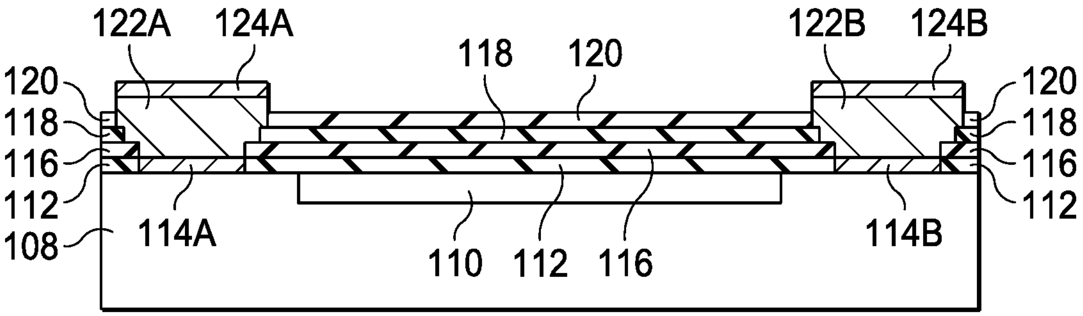

FIG. 1C depicts a cross-sectional view of the semiconductor die 108 and various components (e.g., insulative layers) coupled to the semiconductor die 108. The view of FIG. 1C is taken along the cross-sectional line 109 of FIG. 1A, but the view omits the curved conductive pathway 106, the conductive terminals 104A-104H, and the package body 102. Cross-sectional views of these elements will be depicted and described below. Furthermore, the semiconductor die 108 in the view of FIG. 1C is oriented such that the active surface of the semiconductor die 108 is facing upward. Stated another way, the active surface of the semiconductor die 108 facing away from the reader in FIG. 1A is the active surface facing upward in FIG. 1C.

Still referring to FIG. 1C, the semiconductor die 108 includes a Hall sensor circuit 110 on the active surface of the die. The Hall sensor circuit, as is the case with some or all of the other features in some or all of the drawings in this disclosure, is not necessarily drawn to scale, either individually or with respect to any other drawn feature. A passivation layer 112 is positioned above the Hall sensor circuit 110. In some examples, the passivation layer 112 abuts the active surface of the semiconductor die 108, and in other examples, the passivation layer 112 does not abut the active surface of the semiconductor die 108. Bond pads 114A, 114B are present on the active surface of the semiconductor die 108. The positions of the bond pads 114A, 114B are merely illustrative. In some examples, the bond pads 114A, 114B are co-planar with the passivation layer 112 as shown, although the scope of disclosure is not limited as such. The passivation layer 112 may comprise any suitable passivation material, for example, an oxide such as silicon monoxide or silicon dioxide, or a suitable nitride. In some examples, the passivation layer 112 has a thickness ranging from 1.0 microns to 1.5 microns, although the scope of disclosure is not limited as such. The thickness of the passivation layer 112 is not a mere design choice. Rather, the thickness of the passivation layer 112 may be selected to provide certain benefits. For example, a thinner passivation layer 112 may improve ultraviolet erase performance of some circuits on the die, while a thicker passivation layer 112 can increase the isolation barrier and provide better coverage for thicker metal on the die.

Still referring to FIG. 1C, a polyimide layer 116 is positioned above the passivation layer 112. In some examples, the polyimide layer 116 abuts the passivation layer 112, and in other examples, the polyimide layer 116 does not abut the passivation layer 112. In some examples, the polyimide layer 116 comprises a suitable polyimide material such as a photoactive or non-photoactive polyimide (e.g., HD-4100 or PI-2600). In examples, a polybenzoxazole (PBO) material such as HD-8800 may be used. In some examples, the polyimide layer 116 has a thickness of approximately 10 microns. In some examples, the polyimide layer 116 has a thickness ranging from 8 microns to 12 microns. In some examples, the polyimide layer 116 has a thickness ranging from 5 microns to 15 microns. In examples, the polyimide layer 116 includes an orifice to permit access to the bond pad 114A and another orifice to permit access to the bond pad 114B.

A polyimide layer 118 is positioned above the polyimide layer 116, and another polyimide layer 120 is positioned above the polyimide layer 118. Each of the polyimide layers 118, 120 has properties similar to the properties and/or possible properties of the polyimide layer 116 as described above. In some examples, the polyimide layer 118 abuts the polyimide layer 116, and in other examples, the polyimide layer 118 does not abut the polyimide layer 116. In some examples, the polyimide layer 120 abuts the polyimide layer 118, and in other examples, the polyimide layer 120 does not abut the polyimide layer 118. In some examples, the polyimide layers 116, 118, 120 have the same thickness, and in other examples, each of the polyimide layers 116, 118, 120 may have a different thickness. In some examples, some, but not all, of the polyimide layers 116, 118, 120 share a common thickness. In some examples, the combined thickness of the polyimide layers used (e.g., the polyimide layers 116, 118, 120) is approximately 30 microns. In some examples, this combined thickness ranges from 15 to 25 microns. In some examples, this combined thickness ranges from 25-40 microns. In some examples, this combined thickness ranges from 15 microns to 50 microns. In some examples, this combined thickness ranges from 30 microns to 100 microns. In some examples, this combined thickness is calculable based on the expected voltage between the curved conductive pathway 106 and the Hall sensor circuit 110, as given by the expression:

$$\text{Combined thickness} = \frac{\text{Expected voltage across polyimide}}{\text{Dielectric strength of polyimide}}$$

In some examples, the lengths and widths of the polyimide layers 116, 118, 120 are approximately identical, and in other examples, the lengths and widths of the polyimide layers 116, 118, 120 are different. In some examples, the lengths and widths of some, but not all, of the polyimide layers 116, 118, 120 are approximately identical. In some examples, the polyimide layers 116, 118, 120 comprise the same polyimide material, and in other examples, each of the polyimide layers 116, 118, 120 may comprise a different polyimide material. In some examples, some, but not all, of the polyimide layers 116, 118, 120 share a common polyimide material. Although the various drawings and descriptions herein assume the use of three polyimide layers, in examples, more than three or fewer than three polyimide layers may be used, so long as multiple polyimide layers are used. Furthermore, the precise positioning of the multiple polyimide layers with respect to each other and/or with respect to other layers (e.g., insulative layers) may vary, so long as the multiple polyimide layers are positioned between the curved conductive pathway 106 and the semiconductor die 108.

FIG. 1C also depicts a conductive pillar 122A (e.g., composed of copper or other metal or alloy) coupled to the bond pad 114A and a conductive pillar 122B (e.g., composed of copper or other metal or alloy) coupled to the bond pad 1146. A plating layer 124A (e.g., a tin and silver alloy) abuts a top surface of the conductive pillar 122A, and a plating layer 124B (e.g., a tin and silver alloy) abuts a top surface of the conductive pillar 122B. In some examples, the conductive pillars 122A, 122B have a thickness ranging from 40 microns to 70 microns. In some examples, the plating layers 124A, 124B have a thickness ranging from 20 microns to 30 microns.

Figure 1D:
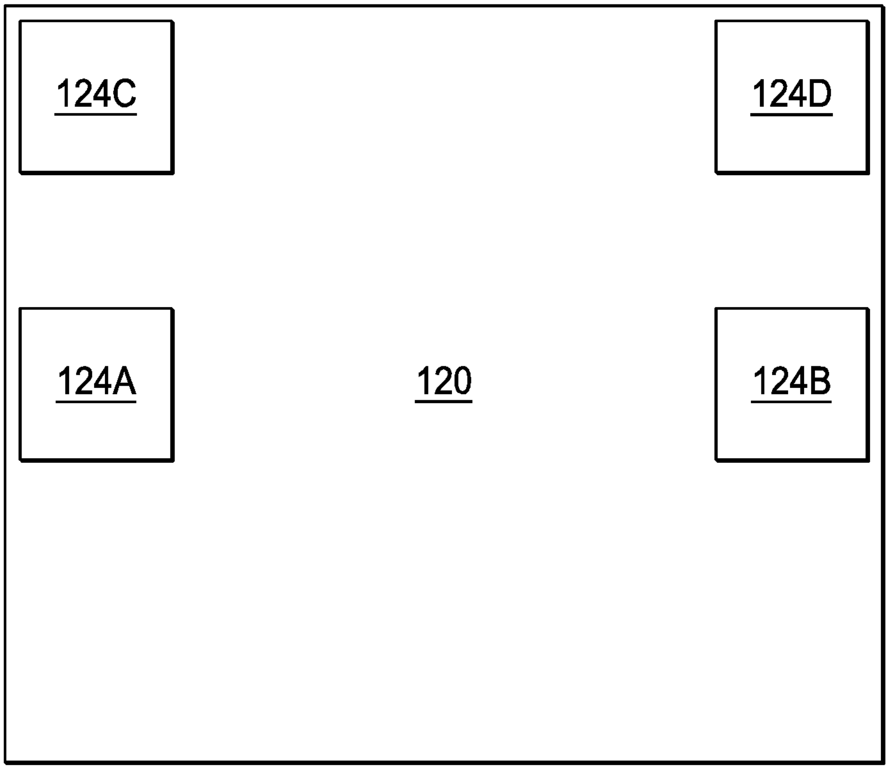

FIG. 1D depicts a top-down view of the structure of FIG. 1C. As shown in FIGS. 1C and 1D, the polyimide layer 120 forms a top layer. Orifices in the polyimide layers 116, 118, 120 permit the conductive pillars 122A, 122B and their plating layers 124A, 124B (FIG. 1C) to extend through the polyimide layers 116, 118, 120, as shown. Comparing FIG. 1D to FIG. 1A, the conductive pillar 122A couples to conductive terminal 104H via the plating layer 124A, and the conductive pillar 122B couples to conductive terminal 104E via the plating layer 124B. Furthermore, FIG. 1D depicts an additional pair of conductive pillars abutting plating layers 124C, 124D, which are not visible in the cross-sectional view of FIG. 1C. The conductive pillar abutting the plating layer 124D couples to conductive terminal 104G (FIG. 1A) via the plating layer 124D, and the conductive pillar abutting the plating layer 124C couples to conductive terminal 104F (FIG. 1A) via the plating layer 124C.

Figure 1E:
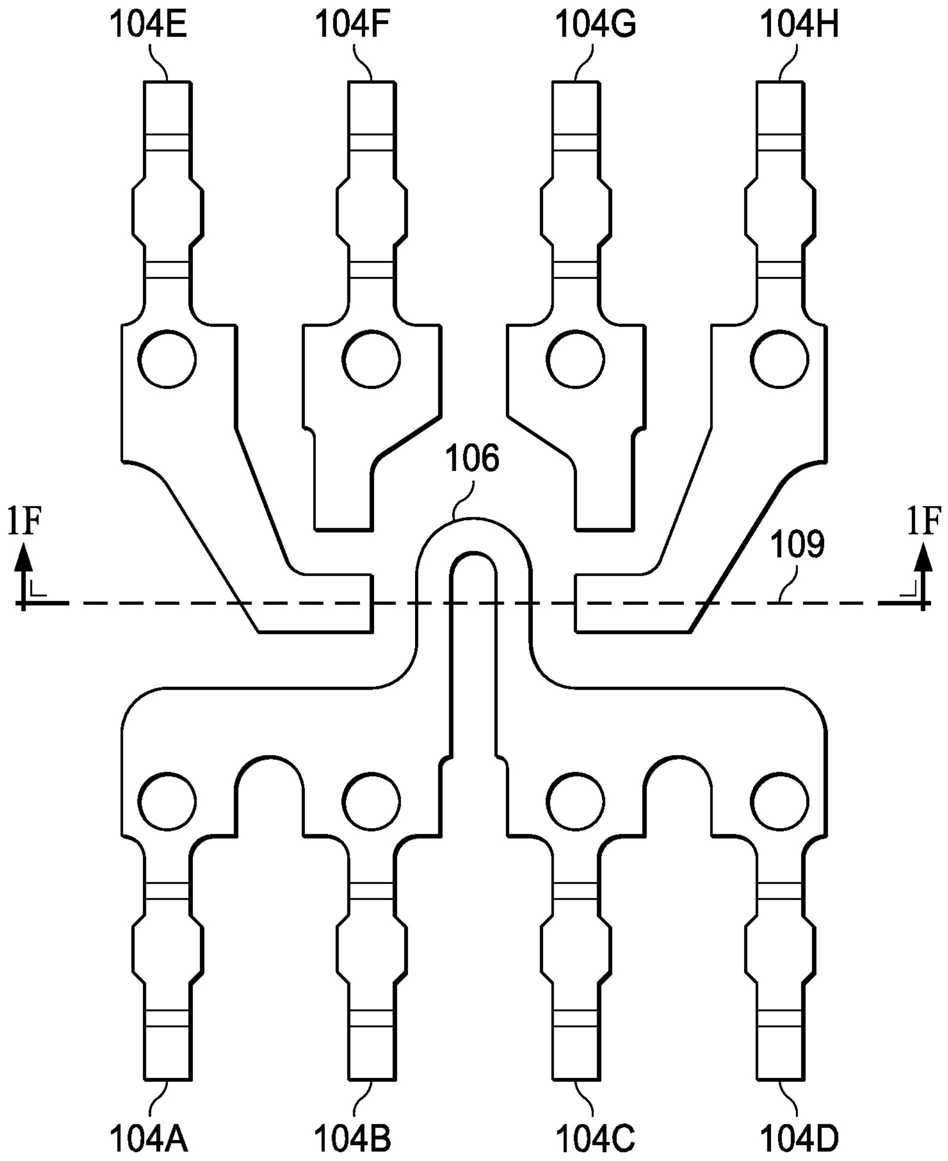

FIG. 1E depicts a top-down view of the conductive terminals 104A-104H. FIG. 1E also depicts the curved conductive pathway 106 coupling the conductive terminals 104A, 104B to the conductive terminals 104C, 104D. Collectively, the components depicted in FIG. 1E may colloquially be referred to as a "lead frame," although these components may have been separated from other frames of a mass-produced roll of frames through a clipping process (e.g., clipping dam bars, tie bars, leads).

Figure 1F:

FIG. 1F depicts a cross-sectional view of the structure of FIG. 1E along cross-sectional line 105 (FIG. 1E). This view includes the conductive terminals 104E, 104H as well as the curved conductive pathway 106.

Figure 1G:
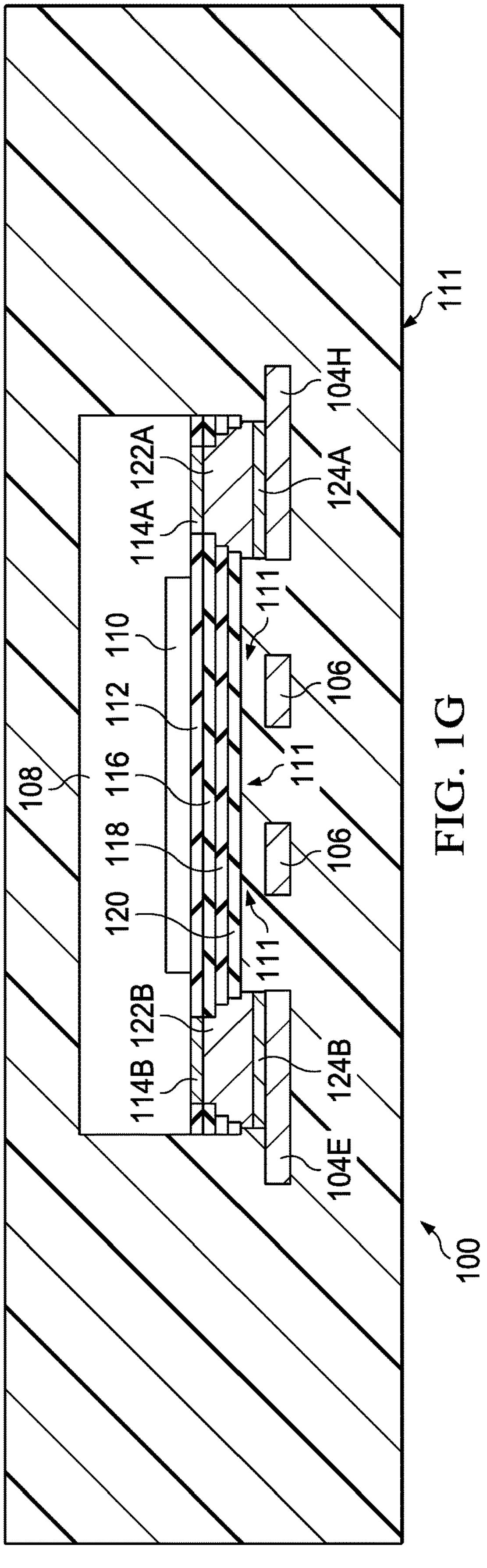

FIG. 1G depicts a cross-sectional view of the Hall sensor package 100 along the cross-sectional line 109 (FIG. 1A). The cross-sectional view of FIG. 1G includes additional components relative to the cross-sectional view of FIG. 1C, and furthermore, the structures depicted in FIGS. 1A and 1G are depicted in the same orientation (e.g., with the active surface of the semiconductor die 108 facing downward). FIG. 1G is a combination of the structure of FIG. 1C as mounted to the conductive terminals of FIG. 1F. As FIG. 1G depicts, the conductive pillar 122A couples to the conductive terminal 104H via the plating layer 124A. A thin solder layer (not expressly shown) may be used to couple the plating layer 124A to the conductive terminal 104H. As FIG. 1G also depicts, the conductive pillar 122B couples to the conductive terminal 104E via the plating layer 124B. A thin solder layer (not expressly shown) may be used to couple the plating layer 124B to the conductive terminal 104E. An area between the polyimide layer 120 and the curved conductive pathway 106 may be filled with an additional insulative layer. In some examples, this area comprises a mold compound layer 111, as shown in FIG. 1G. This mold compound layer 111 is the same mold compound used to cover the remainder of the Hall sensor package 100. In examples, the mold compound layer 111 abuts the polyimide layer 120, the curved conductive pathway 106, the conductive terminals 104E, 104H, and/or the conductive pillars 122A, 122B, as shown.

Figure 1H:
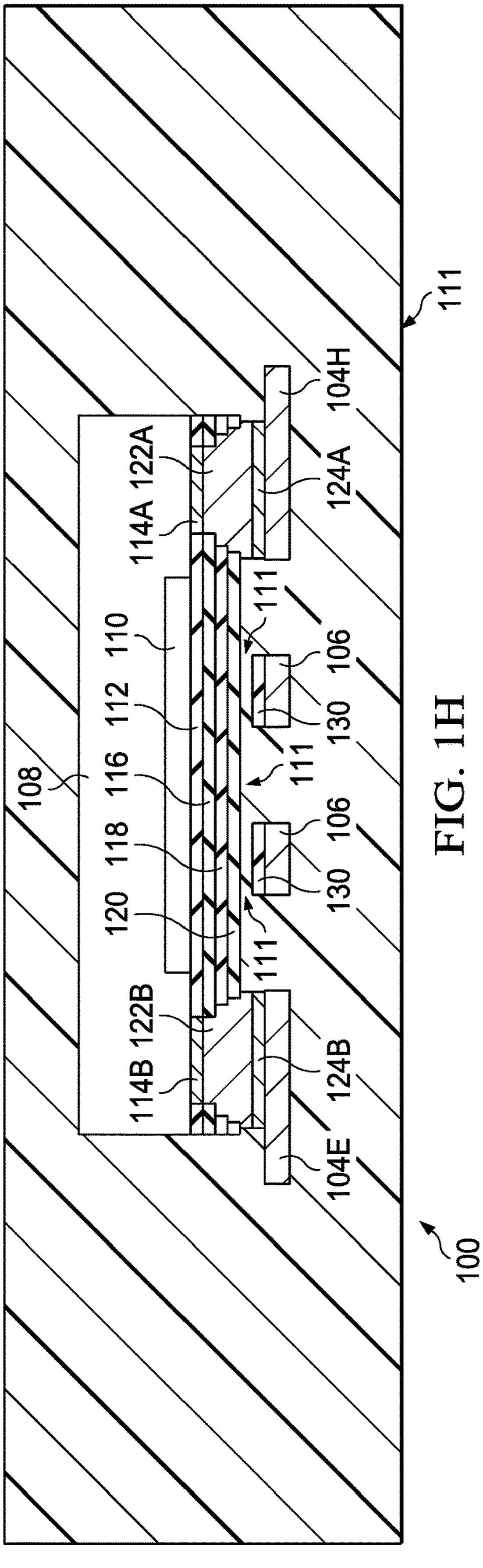
Figure 1I:
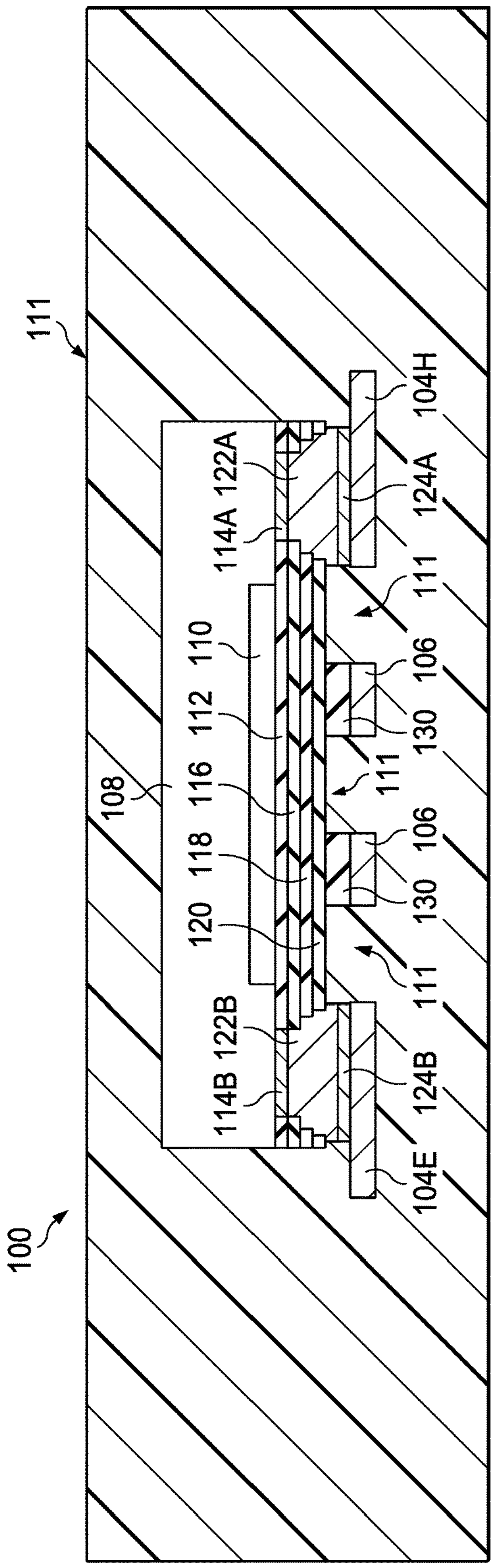

As shown in FIG. 1H, in examples, the area between the polyimide layer 120 and the curved conductive pathway 106 is filled with multiple additional insulative layers, including a mold compound layer 111 and an insulative layer 130. In examples, the insulative layer 130 comprises a resist, such as a solder mask (also referred to as a solder resist). In examples, the insulative layer 130 comprises a tape, such as a polyimide tape, a photoresist, a solder mask dry film (e.g., AUS410®, Dynamask5000®), die-attach films, or other polymers providing acceptable dielectric strength without voids. In examples, the insulative layer 130 comprises a solder mask dry film. In examples, the insulative layer 130 is applied to the curved conductive pathway 106 and not to the remainder of the "lead frame" depicted in FIG. 1E. In examples, the insulative layer 130 is applied en masse when the "lead frame" is still attached to a lead frame roll. For example, the insulative layer 130 may be coupled to the lead frame and subsequently trimmed so that the insulative layer 130 has a shape that is consistent with that of the curved conductive pathway 106 in the horizontal plane. FIG. 1I depicts the structure of FIG. 1H, but with the area between the polyimide layer 120 and the curved conductive pathway 106 fully filled with the insulative layer 130 such that no mold compound is present between the curved conductive pathway 106 and the polyimide layer 120.

The total thickness of all insulative layers between the polyimide layer 120 and the curved conductive pathway 106 should bridge the distance between the polyimide layer 120 and the curved conductive pathway 106. However, the thickness of each individual insulative layer in this space may vary as desired. In some examples, the thickness of the mold compound layer 111 (if included at all) may range from 25 microns to 150 microns. In some examples, the thickness of the insulative layer 130 (if a resist) may range from 2 microns to 40 microns. In some examples, the thickness of the insulative layer 130 (if a tape) may range from 5 microns to 50 microns. These thicknesses are not mere design choices, but rather affect the functionality and reliability of the Hall sensor package 100. For example, a thinner mold compound layer 111 may increase the sensitivity of the device but could increase void formation and thus decrease reliability and durability. Similarly, a thicker insulative layer 130 may provide increased and more durable high voltage isolation, but at the expense of ease of fabrication and device sensitivity. In some examples, insulative layer 130 is omitted.

FIGS. 2A-2K depict a process flow for fabricating the structure of FIG. 1C, which, as described above, may be flipped and mounted on conductive terminals as shown in the examples of FIGS. 1G-1I. As described below, the structure of FIG. 1C may also be incorporated into a wirebond type package.

Figure 2A:
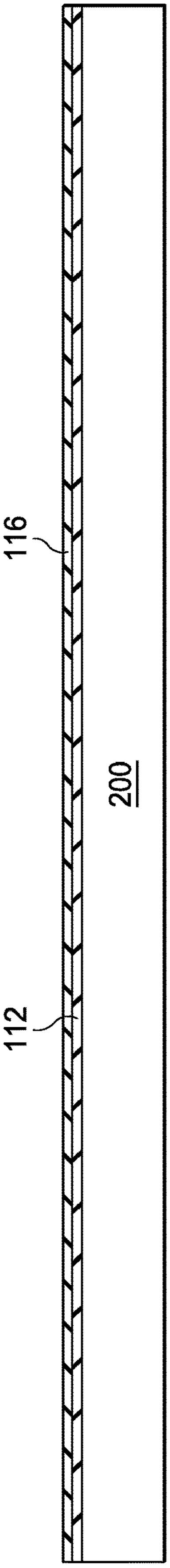
FIGS. 2A-2K depict a process flow for fabricating a Hall sensor semiconductor die having multiple polyimide layers stacked thereupon, in accordance with various examples.

FIG. 2A depicts a semiconductor wafer 200 (e.g., a silicon wafer) having a passivation layer 112 (e.g., a suitable oxide or nitride film) positioned on the semiconductor wafer 200. In addition, FIG. 2A depicts a polyimide layer 116 positioned on the passivation layer 112. In this example, the polyimide layer 116 abuts the passivation layer 112, and the passivation layer 112 abuts the semiconductor wafer 200. The scope of this disclosure, however, is not limited to such abutting. The polyimide layer 116 is formed by positioning a liquid layer of polyimide on the surface of the passivation layer 112. The structure of FIG. 2A is then spun (rotated) to shed excess polyimide, thereby thinning the liquid layer of polyimide in a process referred to as spin coating. The liquid layer of polyimide is subsequently cured to produce the polyimide layer 116. The spin coating technique is beneficial in this context because the resulting polyimide layer 116, unlike mold compound layers, lacks voids. Because there are no voids in the polyimide layer 116 (and in polyimide layers subsequently formed as described below), the dielectric breakdown problems that occur in mold compound layers are avoided in the polyimide layer 116, thus preserving the structural and functional integrity of the polyimide layer 116. The view of FIG. 2A is on a wafer scale to provide perspective on the manner in which the process flow of FIGS. 2A-2K may be performed, but the remaining FIGS. 2B-2K are depicted on a die scale.

Figure 2B:
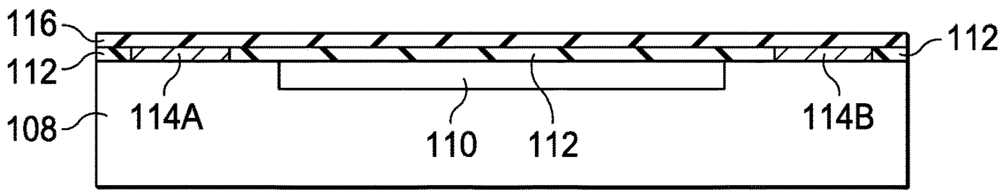

FIG. 2B depicts the cured polyimide layer 116 abutting the passivation layer 112, which, in turn, abuts the active surface of the semiconductor die 108. Specifically, the passivation layer 112 abuts the Hall sensor circuit 110. Bond pads 114A, 114B are positioned adjacent to the passivation layer 112.

Figure 2C:
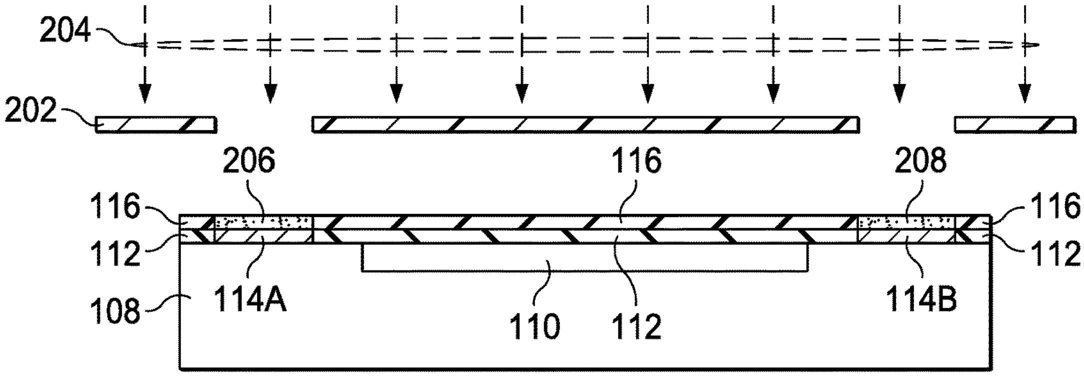

FIG. 2C depicts the structure of FIG. 2B undergoing a photolithography process. In particular, in FIG. 2C, a photomask 202 is positioned above the structure of FIG. 2B and light 204 is directed to the structure, thereby exposing areas 206, 208 of the polyimide layer 116. The photomask 202 may be structure so that the exposed areas 206, 208 are positioned above the bond pads 114A, 114B.

Figure 2D:
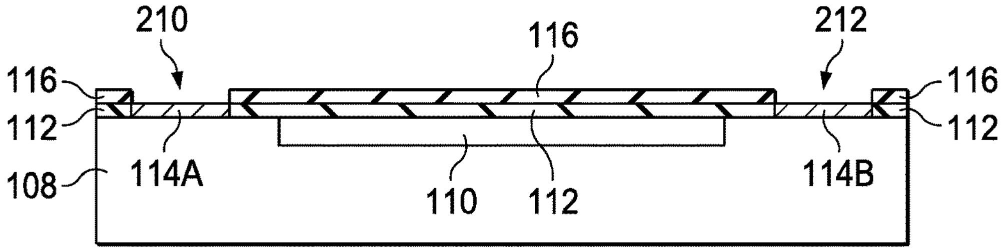

FIG. 2D depicts the structure of FIG. 2C, but with the photomask 202 and light 204 removed and with the exposed areas 206, 208 developed, leaving orifices 210, 212 in place of the exposed areas 206, 208, respectively. In this way, the bond pads 114A, 1146 are accessible for the purpose of coupling bond wires thereto (in case of fabrication of a wirebonded Hall sensor package) or formation of a conductive pillar thereupon (in case of a flip-chip Hall sensor package).

Figure 2E:
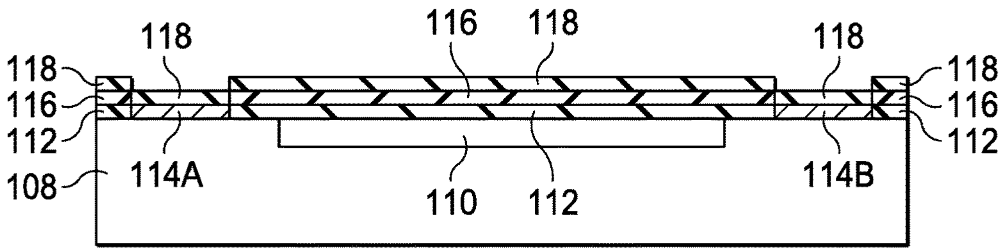

As explained above, in examples, multiple (i.e., two or more) polyimide layers are present between the curved conductive pathway 106 and the semiconductor die 108. Thus, the liquid polyimide deposition, curing, and photolithography processes of FIGS. 2A-2D may be repeated as desired to achieve a target number of polyimide layers. For example, the process may be repeated to produce two polyimide layers, three polyimide layers, four polyimide layers, or five or more polyimide layers. In the examples depicted herein, the use of three polyimide layers is assumed. Accordingly, FIG. 2E depicts the result of spin-coating and curing of another polyimide layer 118. A portion of the polyimide layer 118 abuts the polyimide layer 116. However, in the orifices 210, 212 (FIG. 2D), the polyimide layer 116 is absent, and so in these orifices 210, 212, the polyimide layer 118 abuts the bond pads 114A, 114B.

Figure 2F:
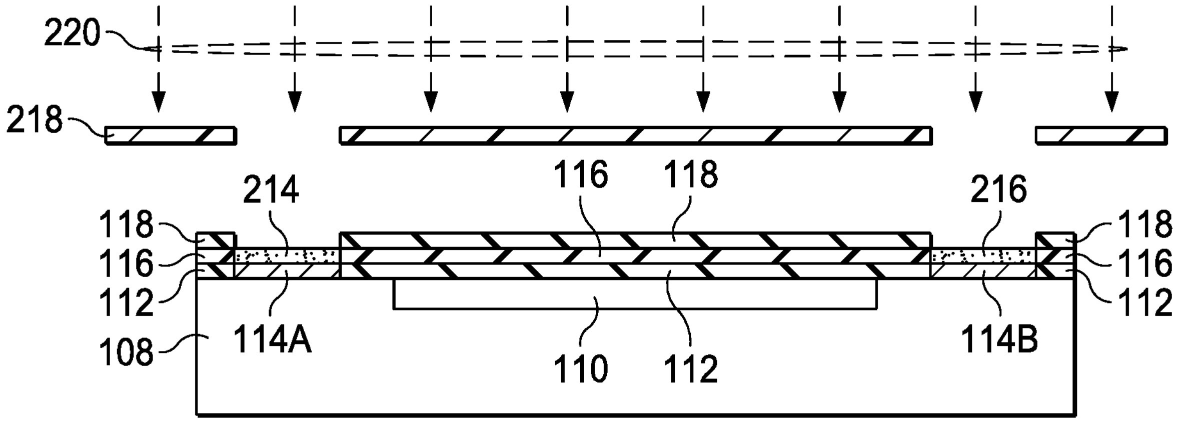
Figure 2G:
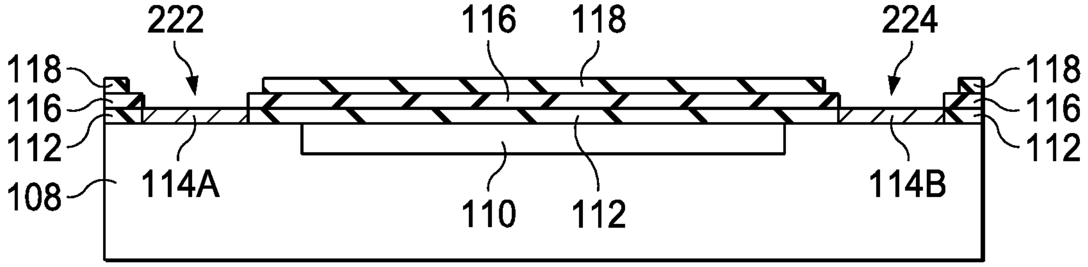

In FIG. 2F, a photolithography process is performed using a photomask 218 and light 220, thereby producing exposed areas 214, 216 in the polyimide layer 118. The exposed areas 214, 216 are formed above the bond pads 114A, 114B, respectively.

FIG. 2F depicts the structure of FIG. 2F, but with the photomask 218 and light 220 removed, and with the exposed areas 214, 216 developed to produce orifices 222, 224, as shown. The orifices 222, 224 provide access to the bond pads 114A, 114B for wirebonding or for conductive pillar formation in flip-chip packaging.

Figure 2H:
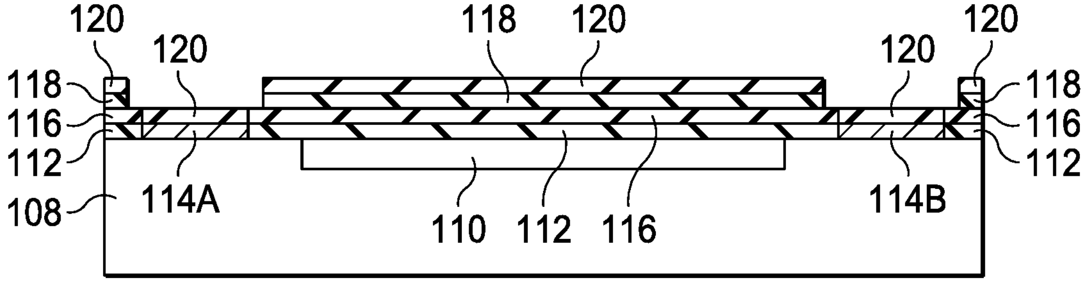
Figure 2I:
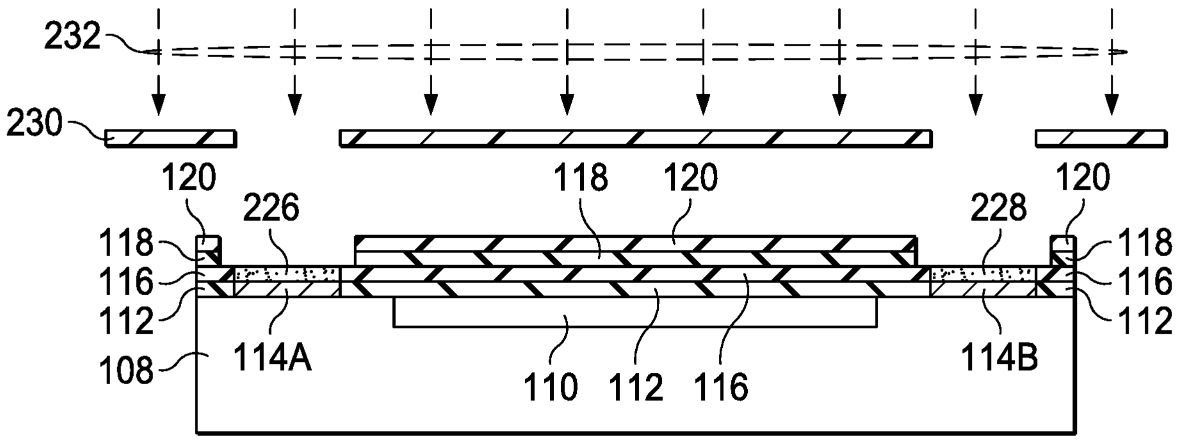
Figure 2J:
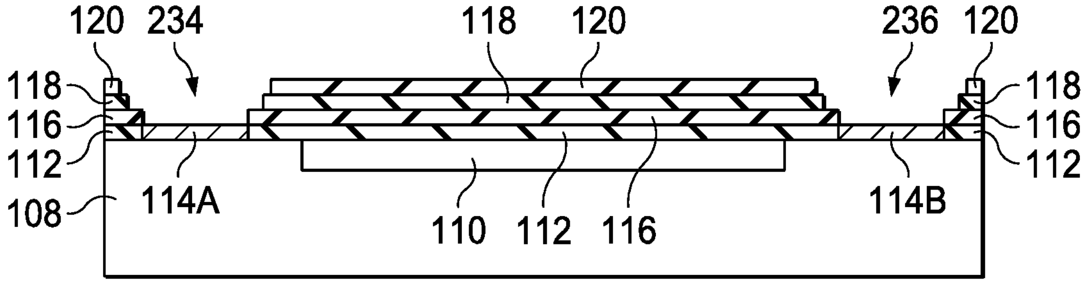

FIG. 2H depicts the result of spin-coating and curing of another polyimide layer 120. The polyimide layer 120 abuts the polyimide layer 118. A portion of the polyimide layer 120 abuts the bond pads 114A, 114B as shown. A photolithography process is performed as shown in FIG. 2I, in which a photomask 230 and light 232 are used to produce exposed areas 226, 228 above the bond pads 114A, 114B. FIG. 2J depicts the structure of FIG. 2I, but with the photomask 230 and light 232 removed, and with the exposed areas 226, 228 developed to produce orifices 234, 236 as shown. Non-photoactive polyimides can also be used, but in such examples, a photoresist is spun coated on top of the polyimide and a developer (such as tetramethylammonium hydroxide) can be used to develop the photoresist and wet etch the polyimide. Alternatively, after the photo resist is patterned, the polyimide can be dry-etched. The photoresist may be removed before curing the polyimide.

Figure 2K:
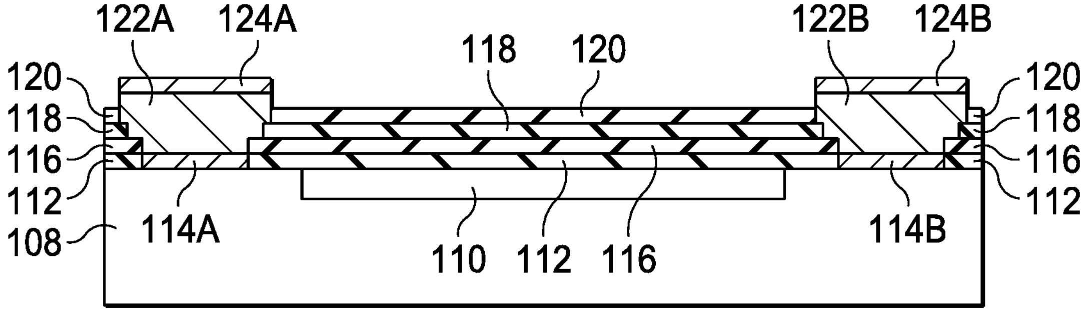

FIG. 2K depicts the structure of FIG. 2J, but with conductive pillars 122A, 122B formed on the bond pads 114A, 1146, respectively, and with plating layers 124A, 124B plated on the conductive pillars 122A, 122B, respectively. The conductive pillars 122A, 122B may be formed using any suitable process, for example, a plating (e.g., electroplating) process. The plating layers 124A, 124B may similarly be formed using a suitable plating (e.g., electroplating) process, albeit with a different metal or alloy than that with which the conductive pillars 122A, 122B are formed. The structure of FIG. 2K is identical to that of FIG. 1C.

As shown in example FIGS. 1G-1I, the structure of FIG. 1K may be incorporated into a flip-chip Hall sensor package 100. However, the scope of disclosure is not limited as such, and any suitable type of package may be used. For example, the structure of FIG. 1K or a structure similar to that of FIG. 1K may be incorporated into a wirebonded Hall sensor package. Accordingly, FIGS. 3A-3E depict various views of wirebonded Hall sensor packages comprising multiple polyimide layers, in accordance with various examples.

Figure 3A:
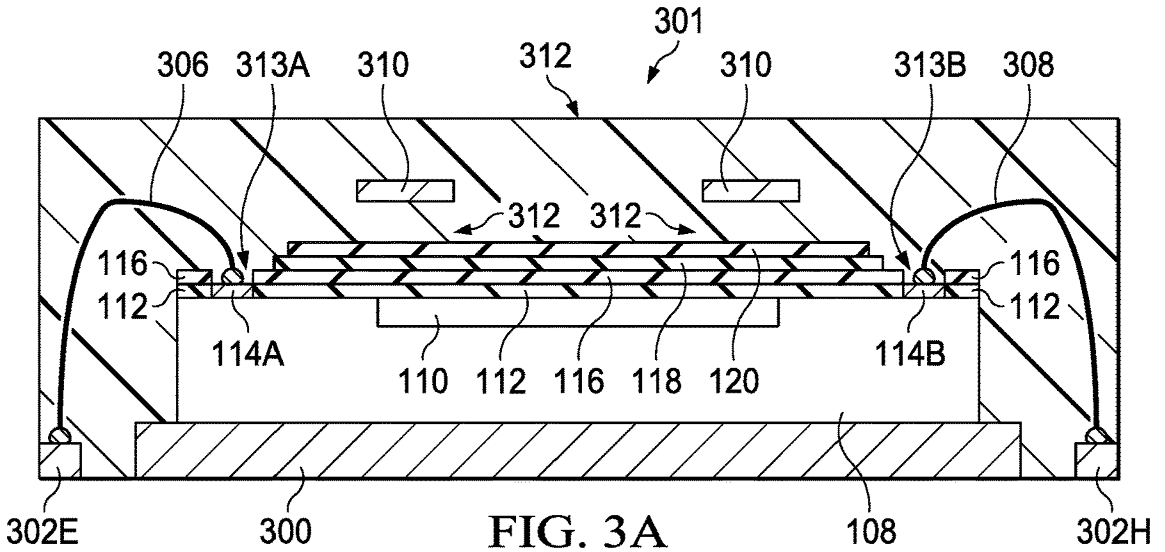
FIGS. 3A-3E depict various views of wirebonded Hall sensor packages comprising multiple polyimide layers, in accordance with various examples.

FIG. 3A depicts a wirebonded Hall sensor package 301. The Hall sensor package 301 includes a die pad 300 and conductive terminals 302E, 302H. The Hall sensor package 301 is a leadless package, such as a quad flat no-lead (QFN) package, although leaded packages (e.g., gullwing style packages) also may be used. The Hall sensor package 301 includes the semiconductor die 108 described above, which, as already explained, includes a Hall sensor circuit 110 on an active surface of the die. The Hall sensor package 301 includes the passivation layer 112 abutting the active surface of the semiconductor die 108, the polyimide layer 116 abutting the passivation layer 112, the polyimide layer 118 abutting the polyimide layer 116, and the polyimide layer 120 abutting the polyimide layer 118. The bond pads 114A, 114B are positioned adjacent to the passivation layer 112.

In FIG. 3A, the properties (e.g., thicknesses) of the various layers (e.g., the polyimide layers) are the same or similar to the properties of the various layers described above with respect to the Hall sensor package 100. However, because the Hall sensor package 301 is a wirebonded package, adequate clearance for the bond wires is beneficial, and so the lengths and widths of the various layers (e.g., the polyimide layers) may be adjusted to provide such bond wire clearance. For example, the polyimide layers 118, 120 in FIG. 3A are shown to be of a lesser width than in, e.g., FIGS. 1G-1I. These polyimide layers may be shortened in width in this manner so long as multiple polyimide layers are still present in the area between the Hall sensor circuit 110 and a curved conductive pathway 310. The physical dimensions of these polyimide layers may be adjusted, for example, by adjusting the photomasks used when forming the polyimide layers. In this way, bond wire 306, which couples the bond pad 114A via an orifice 313A to the conductive terminal 302E, has adequate clearance over the polyimide layers, and bond wire 308, which couples the bond pad 114B via an orifice 313B to the conductive terminal 302H, also has adequate clearance over the polyimide layers. Additional bond wires, not expressly depicted in FIG. 3A, also may benefit from manipulation of the physical dimensions of the polyimide layers to provide clearance. The Hall sensor package 301 further comprises a mold compound layer 312 positioned between the polyimide layer 120 and the curved conductive pathway 310. This mold compound layer 312 is the same mold compound that is used to cover the remainder of the structure of FIG. 3A, as shown.

Figure 3B:
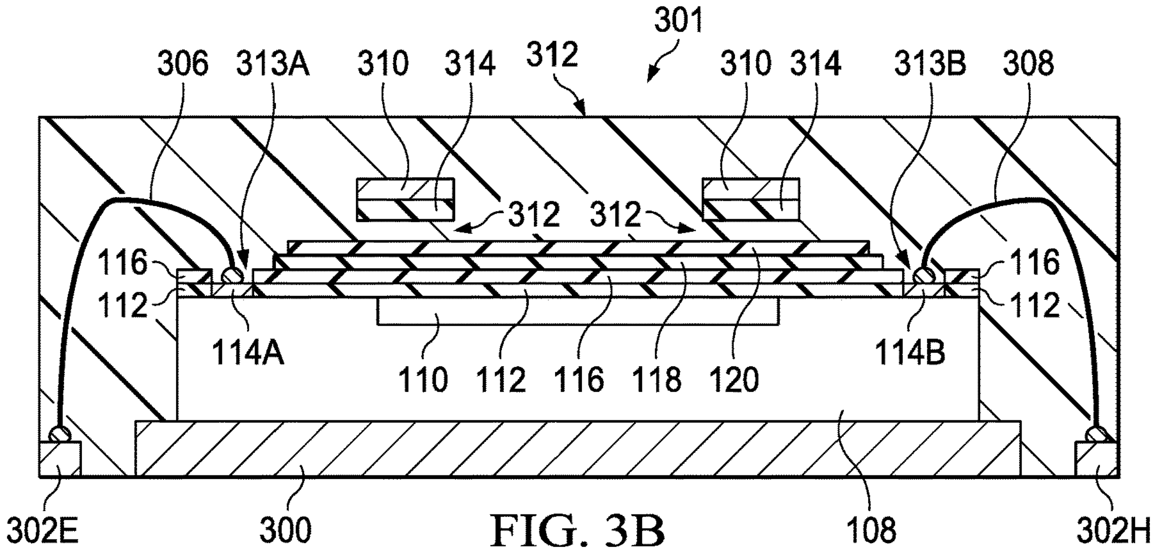
Figure 3C:
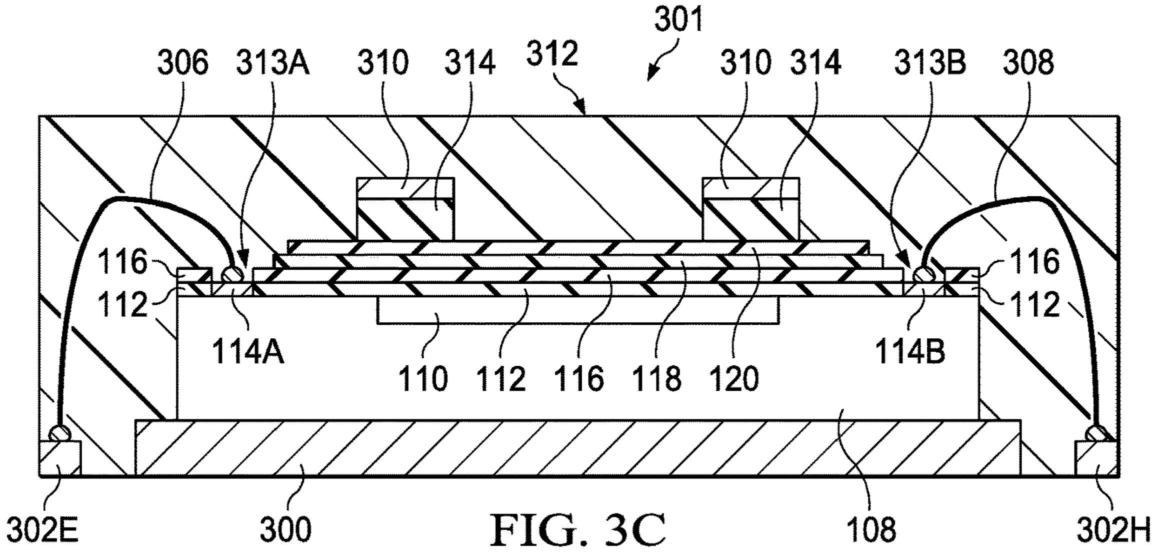

As explained above, an insulative layer, such as a resist (e.g., a solder mask or solder resist) or a tape, may be applied to the curved conductive pathway 106, for example as shown in FIGS. 1H and 1I. A similar insulative layer may be used in the structure of FIG. 3A. Accordingly, FIG. 3B depicts the structure of FIG. 3A, but with an insulative layer 314 positioned on the curved conductive pathway 310, between the curved conductive pathway 310 and the polyimide layer 120. The properties and fabrication process for the insulative layer 314 may be the same or similar to that for the insulative layer 130 described above. As in FIG. 1H, the insulative layer 314 of FIG. 3B occupies less than all of the space between the curved conductive pathway 310 and the polyimide layer 120, thus leaving a mold compound layer 312 positioned between the insulative layer 314 and the polyimide layer 120. As in FIG. 1I, however, in examples, the insulative layer 314 may occupy the full space between the curved conductive pathway 310 and the polyimide layer 120, thus omitting any mold compound in the direct path between the Hall sensor circuit 110 and the curved conductive pathway 310. FIG. 3C depicts such a Hall sensor package 301.

Figure 3D:
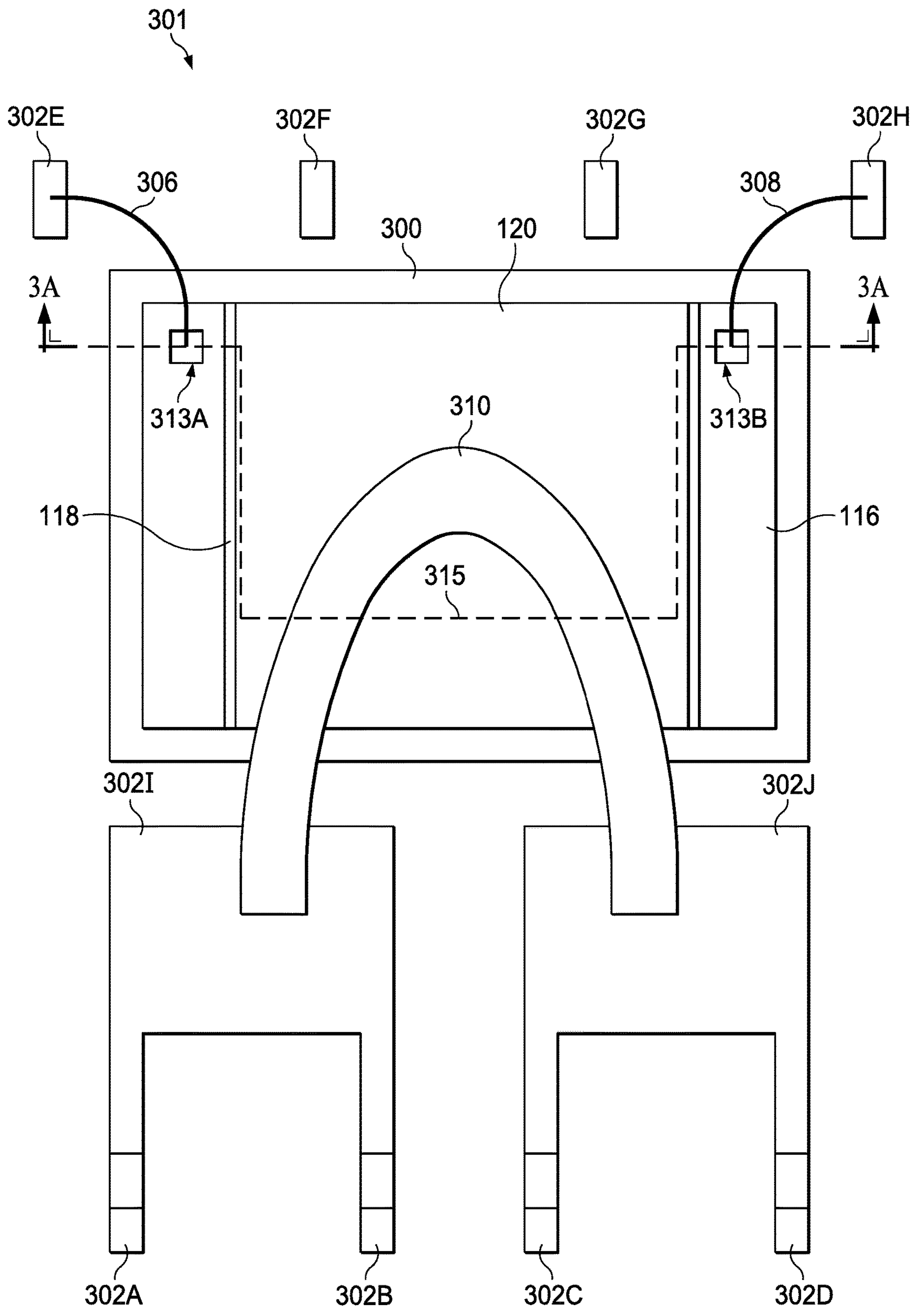

FIG. 3D depicts a top-down view of the structures inside the example Hall sensor packages 301 of FIGS. 3A-3C. The top-down view of FIG. 3D is common to the various Hall sensor packages 301 of FIGS. 3A-3C. The Hall sensor package 301 as depicted in FIG. 3D comprises conductive terminals 302A-302H. In examples, the conductive terminals 302A-302D are part of a row on one side of the Hall sensor package 301 and the conductive terminals 302E-302H are part of another row on an opposing side of the Hall sensor package 301. Conductive terminals 302A, 302B couple together via node 3021. Conductive terminals 302C, 302D couple together via node 302J. The curved conductive pathway 310 couples to the nodes 3021, 302J, but is electrically isolated from the remainder of the structure depicted in FIG. 3D. The top-down view of FIG. 3D further depicts the die pad 300 and the polyimide layers 116, 118, 120. As shown, the polyimide layer 120 has a shorter width than the polyimide layer 118, which, in turn, has a shorter width than the polyimide layer 116. This may be helpful, for example, in providing adequate clearance for the bond wires 306, 308 to travel from their respective orifices 313A, 313B (and the bond pads therein) to their respective conductive terminals 302E, 302H, for example when no portion of the polyimide layers 118, 120 are present on the outer periphery of the polyimide layer 116. Furthermore, such width reductions may be beneficial when more complex bondwire couplings are established, for example, from orifice 313B to conductive terminal 302E (not expressly shown). The hybrid cross-sectional/profile views of FIGS. 3A-3C are provided along line 315 of FIG. 3D.

Figure 3E:
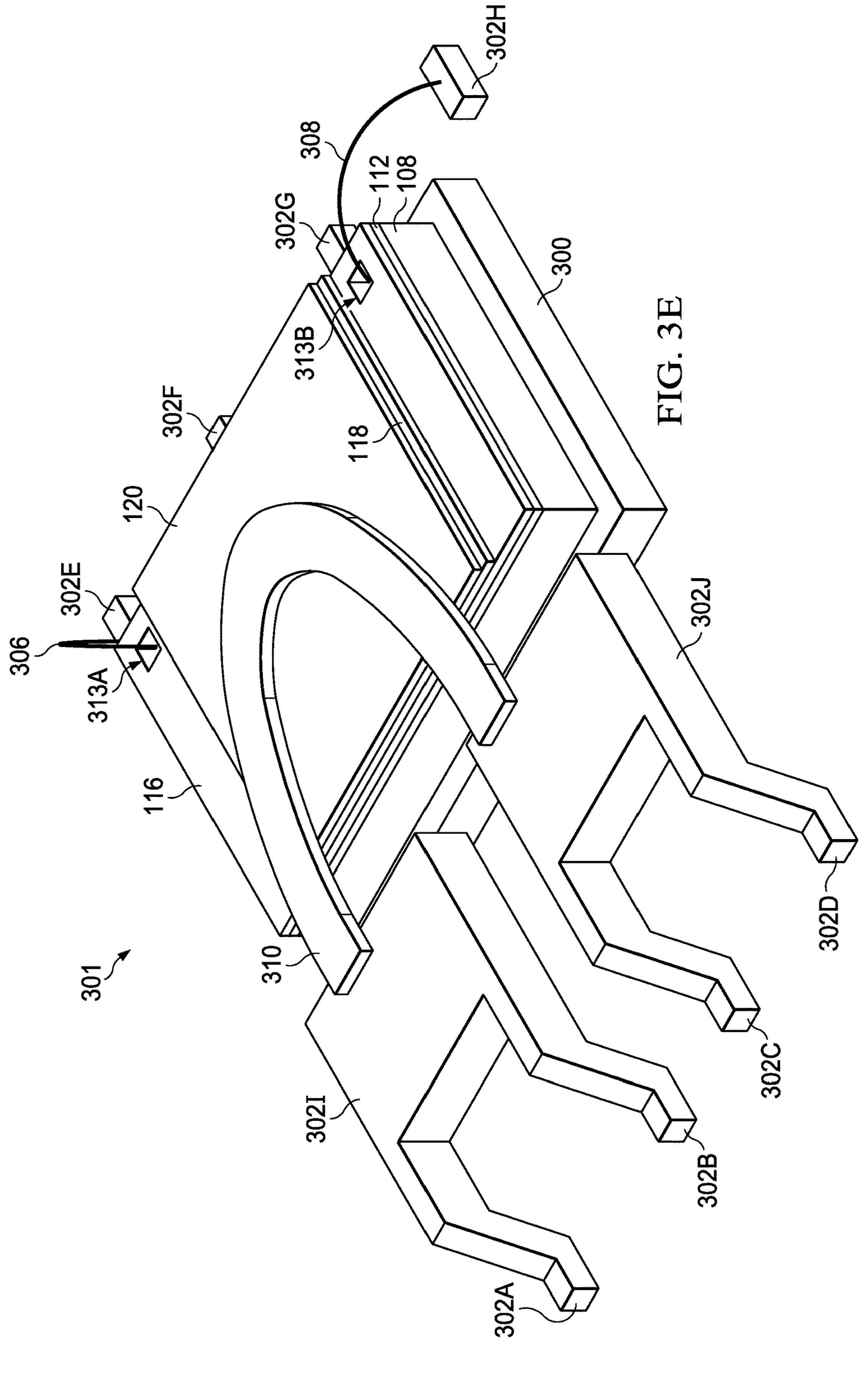

FIG. 3E depicts a perspective view of the structures of FIGS. 3A and 3D. Structures visible in the perspective view of FIG. 3E that are not visible in the top-down view of FIG. 3D include the semiconductor die 108 and the passivation layer 112. Although the curved conductive pathway 310 appears to be suspended above the polyimide layer 120, the mold compound layer 312 (FIGS. 3A-3C) is positioned between the curved conductive pathway 310 and the polyimide layer 120. In other examples, such as in FIG. 3B, a combination of the mold compound layer 312 and another insulative layer 314 are positioned between the curved conductive pathway 310 and the polyimide layer 120. In other examples, such as in FIG. 3C, the insulative layer 314, but not the mold compound 312, is positioned in the direct path between the curved conductive pathway 310 and the polyimide layer 120.

The operation of the foregoing examples is now described. In each of the example Hall sensor packages described herein, such as in FIGS. 1G-1I and 3A-3E, a current flows through the curved conductive pathway (e.g., curved conductive pathways 106, 310). In response to the current, the curved conductive pathway generates a magnetic field. The Hall sensor circuit 110 detects and measures this magnetic field, and additional circuitry processes the measurements as desired. Maintaining isolation between the curved conductive pathway and the Hall sensor circuit is beneficial, particularly in high voltage applications (e.g., a high voltage between the curved conductive pathway and the semiconductor die, for example on the order of 300-1000V or more). The various examples of isolation layers described above—for instance, multiple polyimide layers in combination with a mold compound layer, multiple polyimide layers in combination with a mold compound layer and an additional insulative layer (e.g., a resist or tape layer), and/or multiple polyimide layers in combination with an additional insulative layer (e.g., a resist or tape layer) but without a mold compound layer—maintain the desired isolation between the curved conductive pathway and the Hall sensor circuit. Because the multiple polyimide layers are void-free and are generally regarded as strong dielectrics, and further because the additional insulative layer (e.g., resist or tape) may also be void-free and may be regarded as a strong dielectric, the impact of voids in any mold compound layer(s) on breakdown voltage is mitigated, and the structural and functional integrity of the isolation layer is preserved.

Figure 4:
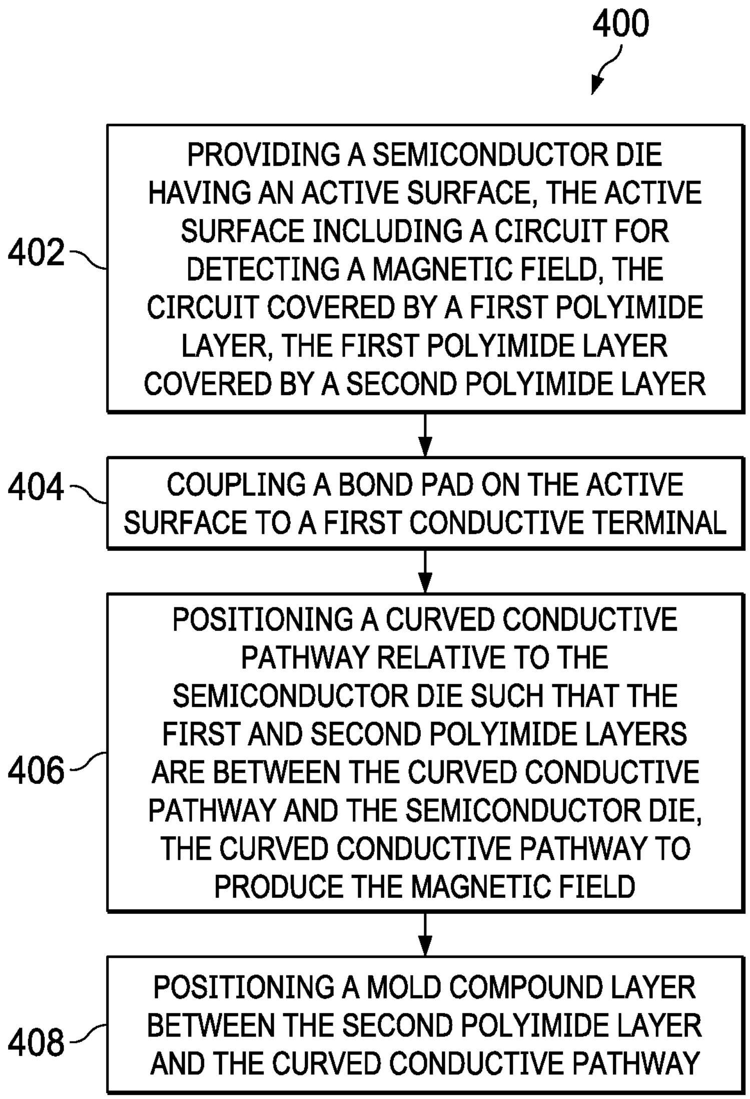
FIG. 4 depicts a flow diagram of a method for fabricating a Hall sensor package comprising multiple polyimide layers, in accordance with various examples.

FIG. 4 depicts a flow diagram of a method 400 for fabricating a Hall sensor package comprising multiple polyimide layers, in accordance with various examples. The method 400 comprises providing a semiconductor die having an active surface, the active surface including a Hall sensor circuit for detecting a magnetic field, the circuit covered by a first polyimide layer, the first polyimide layer covered by a second polyimide layer (402). In examples, additional polyimide layers may be included, for example, a third polyimide layer covering the second polyimide layer. The method 400 also comprises coupling a bond pad on the active surface to a first conductive terminal (404). The method 400 further comprises positioning a curved conductive pathway relative to the semiconductor die such that the first and second polyimide layers are between the curved conductive pathway and the semiconductor die, the curved conductive pathway to produce the magnetic field (406). The method 400 still further comprises positioning a mold compound layer between the second polyimide layer and the curved conductive pathway (408). The method 400 may be adjusted as desired, including by adding, deleting, modifying, or rearranging one or more steps.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A semiconductor package, comprising:
a first conductive terminal;
a second conductive terminal;
a conductive pathway coupling the first and second conductive terminals, the conductive pathway configured to generate a magnetic field;
a semiconductor die including a circuit configured to detect the magnetic field;
a first polyimide layer positioned between the conductive pathway and the semiconductor die;
a second polyimide layer positioned between the first polyimide layer and the conductive pathway;
an insulative layer disposed on a surface of the conductive pathway; and
a mold compound layer encapsulating the semiconductor die, the insulative layer, and the conductive pathway, wherein a portion of the mold compound layer is disposed between the second polyimide layer and the insulative layer;
wherein the second polyimide layer exposes a portion of a surface of the first polyimide layer that is opposite the semiconductor die.

2. The semiconductor package of claim 1, further comprising one or more additional polyimide layers positioned between the conductive pathway and the semiconductor die.

3. The semiconductor package of claim 1, wherein the portion of the mold compound layer abuts the insulative layer and abuts a portion of the second polyimide layer.

4. The semiconductor package of claim 1, wherein the insulative layer is positioned between the conductive pathway and the semiconductor die.

5. The semiconductor package of claim 4, wherein the insulative layer comprises a solder mask.

6. The semiconductor package of claim 4, wherein the insulative layer comprises a polyimide tape.

7. The semiconductor package of claim 1, wherein a combined thickness of the first and second polyimide layers ranges from 15 microns to 25 microns.

8. The semiconductor package of claim 1, wherein the first polyimide layer and the second polyimide layer abut each other, and wherein the first polyimide layer abuts a passivation layer, the passivation layer positioned above the semiconductor die.

9. The semiconductor package of claim 1, wherein the semiconductor die includes a bond pad accessible via an orifice in the first polyimide layer.

10. The semiconductor package of claim 1, wherein:
the first polyimide layer abuts a passivation layer positioned above the semiconductor die; and
the second polyimide layer abuts the second side of the first polyimide layer.

11. The semiconductor package of claim 1, the first polyimide layer being proximate the circuit and the second polyimide layer being proximate the conductive pathway.

12. The semiconductor package of claim 1, wherein a shape of the insulative layer corresponds to a shape of the conductive pathway.

13. The semiconductor package of claim 1, wherein the first polyimide layer abuts the second polyimide layer.

14. The semiconductor package of claim 13, wherein a portion of the first polyimide layer corresponding to the exposed portion of the surface of the first polyimide layer includes a first edge, wherein the second polyimide layer includes a second edge, and wherein the first edge and the second edge are not aligned.

15. The semiconductor package of claim 1, wherein a portion of the first polyimide layer, corresponding to the exposed portion of the surface of the first polyimide layer, surrounds a bond pad of the semiconductor die.

16. The semiconductor package of claim 1, wherein a footprint of the conductive pathway does not overlap with the exposed portion of the surface of the first polyimide layer.

17. A semiconductor package, comprising:
a first conductive terminal; a second conductive terminal;
a conductive pathway coupling the first and second conductive terminals, the conductive pathway configured to generate a magnetic field;
a semiconductor die having a surface that includes a circuit configured to detect the magnetic field;
first, second, and third polyimide layers abutting each other, the circuit positioned closer to the first polyimide layer than to the second and third polyimide layers;
an insulative layer disposed on a surface of the conductive pathway; and
a mold compound layer abutting the third polyimide layer and encapsulating the semiconductor die, the insulative layer, and the conductive pathway, wherein a portion of the mold compound layer is disposed between the third polyimide layer and the insulative layer;
wherein the second polyimide layer exposes a portion of a surface of the first polyimide layer that is opposite the semiconductor die.

18. The semiconductor package of claim 17, wherein the insulative layer abuts the portion of the mold compound layer.

19. The semiconductor package of claim 17, wherein the mold compound layer abuts a portion of the conductive pathway.

20. The semiconductor package of claim 17, wherein a portion of the first polyimide layer surrounds a bond pad of the semiconductor die.

21. The semiconductor package of claim 17, wherein the first polyimide layer abuts the second polyimide layer, and wherein a footprint of the conductive pathway does not overlap with a region of the exposed portion of the surface of the first polyimide layer.

22. The semiconductor package of claim 17, wherein:
the first polyimide layer abuts a passivation layer positioned above the circuit, wherein the first polyimide layer has a first area;
the second polyimide layer abuts the first polyimide layer, wherein the second polyimide layer has a second area less than the first area; and
the third polyimide layer abuts the second polyimide layer, wherein the third polyimide layer has a third area less than the second area.

23. The semiconductor package of claim 17, wherein a shape of the insulative layer corresponds to a shape of the conductive pathway.

24. A semiconductor package, comprising:
a die pad;
a semiconductor die positioned on the die pad, the semiconductor die including a circuit configured to detect a magnetic field;
first and second conductive terminals coupled via a conductive pathway, the conductive pathway configured to generate the magnetic field;
a first polyimide layer positioned between the circuit and conductive pathway;
a second polyimide layer positioned between the first polyimide layer and the conductive pathway;
an insulative layer disposed on a surface of the conductive pathway;
a mold compound layer encapsulating the semiconductor die, the insulative layer, and the conductive pathway, wherein a portion of the mold compound layer is disposed between the second polyimide layer and the insulative layer; and
a bond pad positioned on the semiconductor die and coupled to a third conductive terminal via an orifice in the first polyimide layer,
wherein the second polyimide layer exposes a portion of a surface of the first polyimide layer that is opposite the semiconductor die.

25. The semiconductor package of claim 24, wherein the first polyimide layer and the second polyimide layer abut each other, and wherein the first polyimide layer abuts a passivation layer of the semiconductor die.

26. The semiconductor package of claim 24, wherein the insulative layer comprises a solder mask.

27. The semiconductor package of claim 24, wherein the insulative layer comprises a die attach film.

28. The semiconductor package of claim 24, wherein a portion of the first polyimide layer surrounds the bond pad of the semiconductor die.

29. The semiconductor package of claim 24, wherein the first polyimide layer abuts the second polyimide layer, and wherein a footprint of the conductive pathway does not overlap with a region of the exposed portion of the surface of the first polyimide layer.

30. The semiconductor package of claim 24, wherein:
the first polyimide layer abuts a passivation layer positioned above the circuit; and
the second polyimide layer abuts the first polyimide layer.

31. The semiconductor package of claim 24, wherein a shape of the insulative layer corresponds to a shape of the conductive pathway.

* * * * *